(12) United States Patent
Tsai et al.

(10) Patent No.: US 9,941,249 B2
(45) Date of Patent: Apr. 10, 2018

(54) MULTI-WAFER STACKING BY OX-OX BONDING

(71) Applicant: Taiwan Semiconductor Manufacturing Company, Ltd., Hsin-Chu (TW)

(72) Inventors: Shu-Ting Tsai, Kaohsiung (TW); Szu-Ying Chen, Toufen Township (TW); Jeng-Shyan Lin, Tainan (TW); Tzu-Hsuan Hsu, Kaohsiung (TW); Feng-Chi Hung, Chu-Bei (TW); Dun-Nian Yaung, Taipei (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 15/257,697

(22) Filed: Sep. 6, 2016

(65) Prior Publication Data

US 2016/0379963 A1    Dec. 29, 2016

Related U.S. Application Data

(62) Division of application No. 14/483,908, filed on Sep. 11, 2014, now Pat. No. 9,455,158.

(Continued)

(51) Int. Cl.
*H01L 23/48* (2006.01)
*H01L 25/065* (2006.01)
(Continued)

(52) U.S. Cl.
CPC ...... *H01L 25/0657* (2013.01); *H01L 21/4846* (2013.01); *H01L 21/76877* (2013.01);
(Continued)

(58) Field of Classification Search
CPC . H01L 23/481; H01L 23/482; H01L 23/5226; H01L 21/76898; H01L 2225/06541
See application file for complete search history.

(56) References Cited

U.S. PATENT DOCUMENTS 4,956,312 A   9/1990   Van Laarhoven
6,111,319 A   8/2000   Liou et al.
(Continued)

FOREIGN PATENT DOCUMENTS

CN   101840925 A   9/2010
CN   102299133 A   12/2011
(Continued)

OTHER PUBLICATIONS

Quirk, M., et al., "Semiconductor Manufacturing Process," 2001, Prentice-Hall, Inc, Chapter 12, p. 300.

*Primary Examiner* — Phat X Cao
(74) *Attorney, Agent, or Firm* — Slater Matsil, LLP (57) ABSTRACT

A stacked semiconductor device and a method of forming the stacked semiconductor device are provided. A plurality of integrated circuits are bonded to one another to form the stacked semiconductor device. After each bonding step to bond an additional integrated circuit to a stacked semiconductor device formed at the previous bonding step, a plurality of conductive plugs are formed to electrically interconnect the additional integrated circuit to the stacked semiconductor device formed at the previous bonding step.

20 Claims, 8 Drawing Sheets

Related U.S. Application Data (60) Provisional application No. 62/005,763, filed on May 30, 2014.

(51) Int. Cl.

| | | |
|---|---|---|
| *H01L 21/48* | (2006.01) | |
| *H01L 21/768* | (2006.01) | |
| *H01L 23/522* | (2006.01) | |
| *H01L 23/482* | (2006.01) | |
| *H01L 23/528* | (2006.01) | |
| *H01L 23/00* | (2006.01) | |
| *H01L 25/00* | (2006.01) | |
| *H01L 23/525* | (2006.01) | |

(52) U.S. Cl.
CPC ...... *H01L 21/76898* (2013.01); *H01L 23/481* (2013.01); *H01L 23/482* (2013.01); *H01L 23/528* (2013.01); *H01L 23/5226* (2013.01); *H01L 24/83* (2013.01); *H01L 25/50* (2013.01); *H01L 21/76805* (2013.01); *H01L 23/525* (2013.01); *H01L 2224/83895* (2013.01); *H01L 2224/83896* (2013.01); *H01L 2225/06517* (2013.01); *H01L 2225/06527* (2013.01); *H01L 2225/06541* (2013.01); *H01L 2225/06544* (2013.01); *H01L 2225/06565* (2013.01); *H01L 2924/0002* (2013.01)

(56) References Cited

U.S. PATENT DOCUMENTS

| | | | |
|---|---|---|---|
| 6,207,494 | B1 | 3/2001 | Graimann et al. |
| 7,453,150 | B1 | 11/2008 | McDonald |
| 7,535,920 | B2 | 5/2009 | Robertson |
| 7,642,173 | B2 | 1/2010 | McDonald |
| 8,125,052 | B2 | 2/2012 | Jeng et al. |
| 8,153,521 | B2 | 4/2012 | Kang et al. |
| 8,158,515 | B2 | 4/2012 | Farooq et al. |
| 8,324,736 | B2 | 12/2012 | Kawashita et al. |
| 8,344,514 | B2 | 1/2013 | Cobbley et al. |
| 8,358,008 | B2 | 1/2013 | Wada et al. |
| 8,421,193 | B2 | 4/2013 | Huang |
| 8,525,345 | B2 | 9/2013 | Yen et al. |
| 8,581,414 | B2 | 11/2013 | Fujita |
| 8,592,991 | B2 | 11/2013 | Lee et al. |
| 8,692,382 | B2 | 4/2014 | Yen et al. |
| 8,729,711 | B2 | 5/2014 | Nishio |
| 9,006,804 | B2 | 4/2015 | Hung et al. |
| 9,041,206 | B2 | 5/2015 | Tsai et al. |
| 9,059,696 | B1 | 6/2015 | Rahman |
| 2002/0123219 | A1 | 9/2002 | Laverty et al. |
| 2006/0073695 | A1 | 4/2006 | Filippi et al. |
| 2007/0117348 | A1 | 5/2007 | Ramanathan et al. |
| 2008/0284041 | A1 | 11/2008 | Jang et al. |
| 2009/0014843 | A1 | 1/2009 | Kawashita et al. |
| 2009/0079077 | A1 | 3/2009 | Yang et al. |
| 2009/0134432 | A1 | 5/2009 | Tabata et al. |
| 2009/0166840 | A1 | 7/2009 | Kang et al. |
| 2010/0090317 | A1 | 4/2010 | Zimmermann et al. |
| 2010/0171196 | A1 | 7/2010 | Steadman et al. |
| 2010/0224876 | A1 | 9/2010 | Zhu |
| 2010/0238331 | A1 | 9/2010 | Umebayashi et al. |
| 2011/0062501 | A1 | 3/2011 | Soss et al. |
| 2011/0133339 | A1* | 6/2011 | Wang ............... H01L 21/76898 257/773 |
| 2011/0171582 | A1 | 7/2011 | Farooq et al. |
| 2011/0171827 | A1 | 7/2011 | Farooq et al. |
| 2011/0193197 | A1 | 8/2011 | Farooq et al. |
| 2012/0038020 | A1 | 2/2012 | Lin et al. |
| 2012/0038028 | A1 | 2/2012 | Yaung et al. |
| 2012/0056330 | A1 | 3/2012 | Lee et al. |
| 2012/0181698 | A1 | 7/2012 | Xie et al. |
| 2012/0193785 | A1* | 8/2012 | Lin ................... H01L 21/76229 257/737 |
| 2012/0261827 | A1 | 10/2012 | Yu et al. |
| 2013/0062761 | A1 | 3/2013 | Lin et al. |
| 2013/0093098 | A1 | 4/2013 | Yang et al. |
| 2013/0140680 | A1 | 6/2013 | Harada et al. |
| 2013/0264688 | A1* | 10/2013 | Qian ..................... H01L 23/481 257/622 |
| 2013/0270625 | A1 | 10/2013 | Jang et al. |
| 2013/0292794 | A1 | 11/2013 | Pai et al. |
| 2014/0070426 | A1 | 3/2014 | Park et al. |
| 2014/0175653 | A1 | 6/2014 | Sandhu et al. |
| 2014/0247380 | A1 | 9/2014 | Hynecek |
| 2014/0264709 | A1 | 9/2014 | Tsai et al. |
| 2014/0264862 | A1 | 9/2014 | Tsai et al. |
| 2014/0264911 | A1 | 9/2014 | Lin et al. |
| 2014/0264947 | A1 | 9/2014 | Lin et al. |
| 2014/0361347 | A1 | 12/2014 | Kao |
| 2015/0129942 | A1 | 5/2015 | Kao |
| 2015/0137238 | A1 | 5/2015 | Tsunemi et al. |
| 2015/0179612 | A1 | 6/2015 | Tsai et al. |
| 2015/0179613 | A1 | 6/2015 | Tsai et al. |
| 2015/0187701 | A1 | 7/2015 | Tsai et al. |
| 2015/0221695 | A1 | 8/2015 | Park et al. |
| 2015/0228584 | A1 | 8/2015 | Huang et al. |
| 2015/0243582 | A1 | 8/2015 | Klewer |
| 2015/0348874 | A1 | 12/2015 | Tsai et al. |
| 2015/0348917 | A1 | 12/2015 | Tsai et al. |
| 2016/0020170 | A1 | 1/2016 | Ho et al. |
| 2016/0086997 | A1 | 5/2016 | Okamoto |

FOREIGN PATENT DOCUMENTS

| | | |
|---|---|---|
| CN | 102339813 A | 2/2012 |
| CN | 102468279 A | 5/2012 |
| CN | 102569314 A | 7/2012 |
| CN | 102867777 A | 1/2013 |
| CN | 103000593 A | 3/2013 |
| CN | 103367348 A | 10/2013 |
| CN | 104051414 A | 9/2014 |
| JP | 2008305897 A | 12/2008 |
| JP | 2010114165 A | 5/2010 |
| JP | 2013251511 A | 12/2013 |
| KR | 20100094905 A | 8/2010 |
| KR | 20130116607 A | 10/2013 |
| KR | 20140000719 A | 1/2014 |
| WO | 2011033601 A1 | 3/2011 |

\* cited by examiner

MULTI-WAFER STACKING BY OX-OX BONDING

PRIORITY CLAIM AND CROSS-REFERENCE

This application is a divisional of U.S. patent application Ser. No. 14/483,908, filed on Sep. 11, 2014, entitled "3DIC Interconnect Devices and Methods of Forming Same," which claims the benefit of U.S. Provisional Application Ser. No. 62/005,763, filed on May 30, 2014, entitled "Multi-Wafer Stacking by Oxide-Oxide Bonding," which applications are hereby incorporated herein by reference in their entireties.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked semiconductor devices, e.g., 3D integrated circuits (3DIC), have emerged as an effective alternative to further reduce the physical size of a semiconductor device. In a stacked semiconductor device, active circuits such as logic, memory, processor circuits and the like are fabricated on different semiconductor wafers. Two or more semiconductor wafers may be stacked on top of one another to further reduce the form factor of the semiconductor device.

Two semiconductor wafers may be bonded together through suitable bonding techniques. The commonly used bonding techniques include direct bonding, chemically activated bonding, plasma activated bonding, anodic bonding, eutectic bonding, glass frit bonding, adhesive bonding, thermo-compressive bonding, reactive bonding and/or the like. An electrical connection may be provided between the stacked semiconductor wafers. The stacked semiconductor devices may provide a higher density with smaller form factors and allow for increased performance and lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure will be described with respect to embodiments in a specific context, namely, a method for forming interconnect structures for a stacked semiconductor device. Other embodiments, however, may be applied to a variety of semiconductor devices. Hereinafter, various embodiments will be explained in detail with reference to the accompanying drawings.

Figure 1:
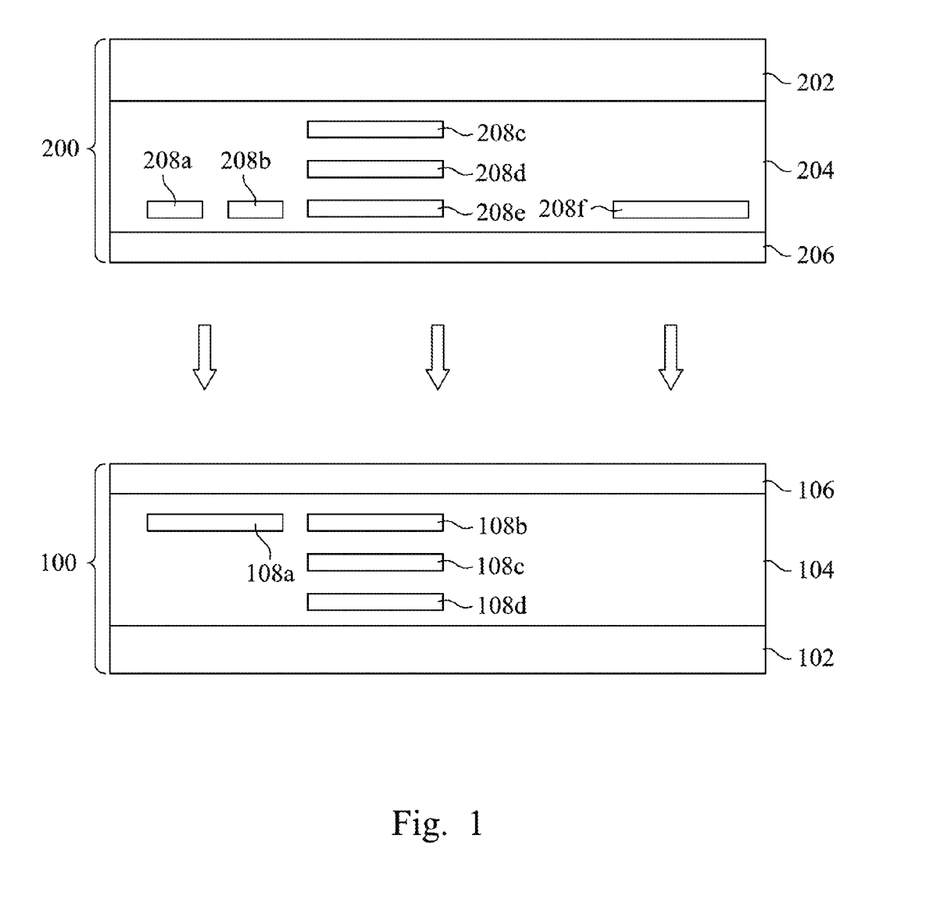
FIGS. 1-6 are cross-sectional views of various processing steps during fabrication of interconnect structures between a plurality of bonded workpieces in accordance with some embodiments.

FIGS. 1-6 are cross-sectional views of various processing steps during fabrication of interconnect structures between a plurality of bonded workpieces in accordance with some embodiments. Referring first to FIG. 1, a first workpiece 100 and a second workpiece 200 is shown prior to a bonding process in accordance with various embodiments. In an embodiment, the second workpiece 200 has similar features as the first workpiece 100, and for the purpose of the following discussion, the features of the second workpiece 200 having reference numerals of the form "2xx" are similar to features of the first workpiece 100 having reference numerals of the form "1xx." The various elements of the first workpiece 100 and the second workpiece 200 will be referred to as the "first <element> 1xx" and the "second <element> 2xx," respectively.

In an embodiment, the first workpiece 100 comprises a first substrate 102. The first substrate 102 may be formed of silicon, although it may also be formed of other group III, group IV, and/or group V elements, such as silicon, germanium, gallium, arsenic, and combinations thereof. The first substrate 102 may also be in the form of silicon-on-insulator (SOI). The SOI substrate may comprise a layer of a semiconductor material (e.g., silicon, germanium and/or the like) formed over an insulator layer (e.g., buried oxide and/or the like), which is formed on a silicon substrate. In addition, other substrates that may be used include multi-layered substrates, gradient substrates, hybrid orientation substrates, any combinations thereof and/or the like.

The first substrate 102 may further comprise a variety of electrical circuits (not shown). The electrical circuits formed on the first substrate 102 may be any type of circuitry suitable for a particular application. In accordance with some embodiments, the electrical circuits may include various n-type metal-oxide semiconductor (NMOS) and/or p-type metal-oxide semiconductor (PMOS) devices such as transistors, capacitors, resistors, diodes, photo-diodes, fuses and/or the like.

The electrical circuits may be interconnected to perform one or more functions. The functions may include memory structures, processing structures, sensors, amplifiers, power distribution, input/output circuitry and/or the like. One of ordinary skill in the art will appreciate that the above examples are provided for illustrative purposes only and are not intended to limit the various embodiments to any particular applications.

Referring further to FIG. 1, first inter-metal dielectric (IMD) layers 104 are formed over the first substrate 102. As shown in FIG. 1, the first IMD layers 104 may comprise first interconnects 108a-108d (collectively referred to as first interconnects 108). The first IMD layers 104 and the first interconnects 108 form first metallization layers over the first substrate 102. Generally, metallization layers are used to interconnect the electrical circuitry to each other and to provide an external electrical connection. One skilled in the art will appreciate that number of stacked layers and the number and placement of the interconnects within the respective layers are provided for illustration only and are not limiting the scope of the present disclosure. In some embodiments, the interconnects comprise conductive lines/traces, and conductive vias extending between and interconnecting vertically adjacent conductive lines/traces.

The first IMD layers 104 may be formed, for example, of a low-K dielectric material, such as phosphosilicate glass (PSG), borophosphosilicate glass (BPSG), FSG, $SiO_xC_y$, Spin-On-Glass, Spin-On-Polymers, silicon carbon material, compounds thereof, composites thereof, combinations thereof, or the like, by any suitable method known in the art, such as spinning, chemical vapor deposition (CVD), and plasma-enhanced CVD (PECVD).

The first interconnects 108 may be formed through any suitable formation process (e.g., lithography with etching, damascene, dual damascene, or the like) and may be formed using suitable conductive materials such as copper, aluminum, aluminum alloys, copper alloys or the like. In some embodiments, each of the first interconnects 108 may further comprise a diffusion barrier layer and/or an adhesion layer (not shown) to protect the first IMD layers from metal poisoning. The diffusion barrier layer may comprise one or more layers of TaN, Ta, TiN, Ti, CoW, or the like, and may be deposited by physical vapor deposition (PVD), or the like.

FIG. 1 further illustrates a first bonding layer 106 formed over the first IMD layers 104 of the first workpiece 100. As described below the first bonding layer 106 is subsequently used to bond the first workpiece 100 and the second workpiece 200, and may comprise any suitable material for bonding depending on a particular bonding method used. In some embodiments, the first bonding layer 106 is a first passivation layer 106. The first passivation layer 106 may be formed of one or multiple layers comprising silicon oxide, silicon nitride, silicon oxynitride, silicon carbide, silicon oxycarbide, undoped silicon glass, phosphosilicate glass, compounds thereof, composites thereof, combinations thereof, or the like, deposited by any suitable method, such as spin-on, CVD, PECVD, or the like. These materials and processes are provided as examples and other materials and processes may be used.

It should also be noted that one or more etch stop layers (not shown) may be positioned between adjacent layers of the first workpiece 100, e.g., the first IMD layers 104 and the first substrate 102, or between individual layers of the first IMD layers 104. Generally, the etch stop layers provide a mechanism to stop an etching process when forming vias and/or contacts. The etch stop layers are formed of a dielectric material having a different etch selectivity from adjacent layers, e.g., the underlying first substrate 102 and the overlying first IMD layers 104. In an embodiment, etch stop layers may be formed of SiN, SiCN, SiCO, CN, combinations thereof, or the like, deposited by CVD or PECVD techniques.

In some embodiments, the first workpiece 100 and the second workpiece 200 may be wafers and/or dies formed using a complementary metal-oxide-semiconductor (CMOS) process, a micro-electro-mechanical systems (MEMS) process, or the like. The first workpiece 100 and the second workpiece 200 may be sensor wafers and/or dies such as, for example, a backside illumination sensor (BIS) wafer and/or die, logic wafers and/or dies such as, for example, application-specific integrated circuit (ASIC) devices comprising analog-to-digital converters, data processing circuits, memory circuits, bias circuits, reference circuits, any combinations thereof and/or the like.

In an embodiment, the first workpiece 100 and the second workpiece 200 are arranged with device sides (also referred as front sides) of the first substrate 102 and the second substrate 202 facing each other as illustrated in FIG. 1. As discussed in greater detail below, the first workpiece 100 and the second workpiece 200 will be bonded and openings will be formed extending from a backside (opposite the device side) of the second workpiece 200 to the selected portions of the first interconnects 108 of the first workpiece 100, such that portions of selected second interconnects 208 of the second workpiece 200 will also be exposed. The openings will be subsequently filled with a conductive material, thereby forming electrical contacts on the backside of the second workpiece 200 to electrically interconnect the first workpiece 100 and the second workpiece 200. Subsequently, one or more additional workpieces will be bonded to the first workpiece 100 and the second workpiece 200 and additional interconnect structures will be formed to eclectically interconnect the one or more additional workpieces to the first workpiece 100 and the second workpiece 200.

Figure 2:
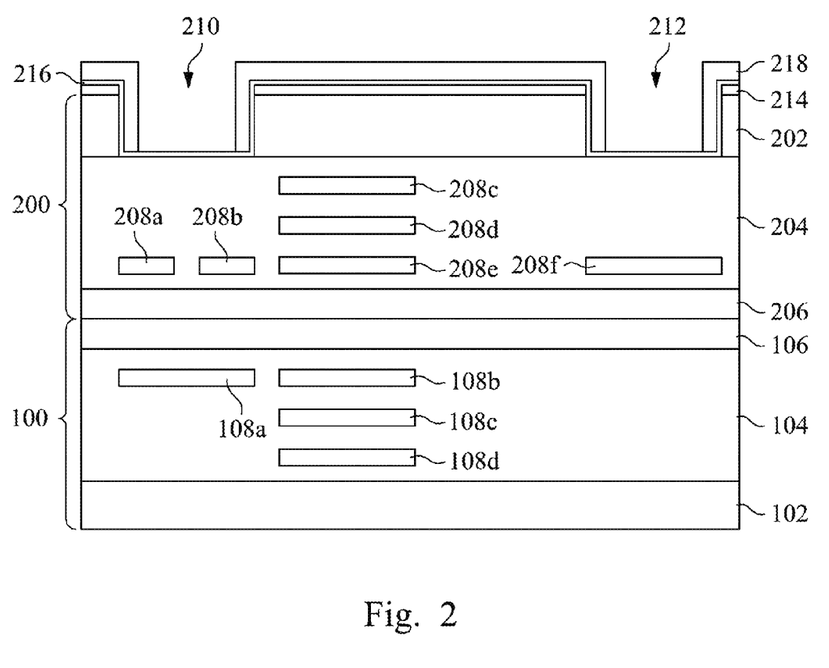

FIG. 2 illustrates the first workpiece 100 and the second workpiece 200 after bonding in accordance with an embodiment. As shown in FIG. 1, the second workpiece 200 will be stacked and bonded on top of the first workpiece 100. In the illustrated embodiment, the first workpiece 100 and the second workpiece 200 are bonded using dielectric-to-dielectric bonding (e.g., oxide-to-oxide bonding) by bonding the first passivation layer 106 of the first workpiece 100 to the second passivation layer 206 of the second workpiece 200. In other embodiments, the first workpiece 100 and the second workpiece 200 may be bonded using, for example, a direct bonding process such as metal-to-metal bonding (e.g., copper-to-copper bonding), metal-to-dielectric bonding (e.g., oxide-to-copper bonding), hybrid boding (e.g., dielectric-to-dielectric and metal-to-metal bonding), any combinations thereof and/or the like.

It should be noted that the bonding may be at wafer-to-wafer level, wherein the first workpiece 100 and the second workpiece 200 are bonded together, and are then singulated into separated dies. Alternatively, the bonding may be performed at the die-to-die level, or the die-to-wafer level.

After the first workpiece 100 and the second workpiece 200 are bonded, a thinning process may be applied to the backsides of the first workpiece 100 and/or the second workpiece 200. The thinning process may be implemented by using suitable techniques such as grinding, polishing, a SMARTCUT® procedure, an ELTRAN® procedure, and/or chemical etching.

Referring further to FIG. 2, a first opening 210 and a second opening 212 are formed on the backside of the second workpiece 200. As discussed in greater detail below, electrical connections will be formed extending from a backside of the second workpiece 200 to select ones of the first interconnects 108 of the first workpiece 100 and to select ones of the second interconnects 208 of the second workpiece 200. The first opening 210 and the second opening 212 represent openings in which the backside contacts will be formed. The first opening 210 and the second opening 212 may be formed using photolithography techniques. Generally, photolithography techniques involve depositing a photoresist material, which is subsequently irradiated (exposed) and developed to remove a portion of the photoresist material. The remaining photoresist material protects the underlying material from subsequent processing steps, such as etching. A suitable etching process, such as a reactive ion etch (RIE) or other dry etch, an anisotropic wet etch, or any other suitable anisotropic etch or patterning process may be applied to the second substrate 202 of the second workpiece 200. As a result, the first opening 210 and the second opening 212 are formed in the second substrate 202.

Also shown in FIG. 2 is an optional anti-reflection coating (ARC) layer 214. The ARC layer 214 reduces the reflection of the exposure light used during the photolithography process to pattern a patterned mask (not shown), which reflection may cause inaccuracies in the patterning. The ARC layer 214 may be formed of a nitride material (e.g., silicon nitride), an organic material (e.g., silicon carbide), an oxide material, high-k dielectric, and the like. The ARC layer 214 may be formed using suitable techniques such as CVD and/or the like.

Other layers may be used in the patterning process. For example, one or more optional hard mask layers may be used to pattern the second substrate 202. Generally, one or more hard mask layers may be useful in embodiments in which the etching process requires masking in addition to the masking provided by the photoresist material. During the subsequent etching process to pattern the second substrate 202, the patterned photoresist mask will also be etched, although the etch rate of the photoresist material may not be as high as the etch rate of the second substrate 202. If the etch process is such that the patterned photoresist mask would be consumed before the etching process is completed, then an additional hard mask may be utilized. The material of the hard mask layer or layers is selected such that the hard mask layer(s) exhibit a lower etch rate than the underlying materials, such as the materials of the second substrate 202.

Referring further to FIG. 2, a dielectric film 216 is formed over the backside of the second substrate 202 and along sidewalls and bottoms of the first opening 210 and the second opening 212 in accordance with an embodiment. The dielectric film 216 provides greater passivation and isolation between electrical contacts formed in the first opening 210 and the second opening 212, and device circuits formed on the second substrate 202. In some embodiments, the dielectric film 216 comprises a multilayer structure, which provides greater protection than a single film during, for example, a subsequent etch process to form electrical contacts to selected ones of the first interconnects 108 and the second interconnects 208. Additionally, the dielectric film 216 may provide protection against metal ions diffusing into the second substrate 202.

The dielectric film 216 may be formed of various dielectric materials commonly used in integrated circuit fabrication. For example, the dielectric film 216 may be formed of silicon dioxide, silicon nitride or a doped glass layer such as boron silicate glass and the like. Alternatively, dielectric layer may be a layer of silicon nitride, silicon oxynitride, polyamide, a low-k dielectric, or a high-k dielectric, or the like. In addition, a combination of the foregoing dielectric materials may also be used to form the dielectric film 216. In some embodiments, the dielectric film 216 may be formed using suitable techniques such as sputtering, oxidation, CVD and/or the like.

FIG. 2 further illustrates a patterned mask 218 formed over the backside of the second substrate 202 in accordance with an embodiment. The patterned mask 218 may be, for example, a photoresist material that has been deposited, masked, exposed, and developed as part of a photolithography process. The patterned mask 218 is patterned to define via openings extending through the second IMD layers 204 of the second substrate 202 and at least some of the first IMD layers 104 of the first substrate 102, thereby exposing portions of select ones of the first interconnects 108 and the second interconnects 208, as explained in greater detail below.

Figure 3:
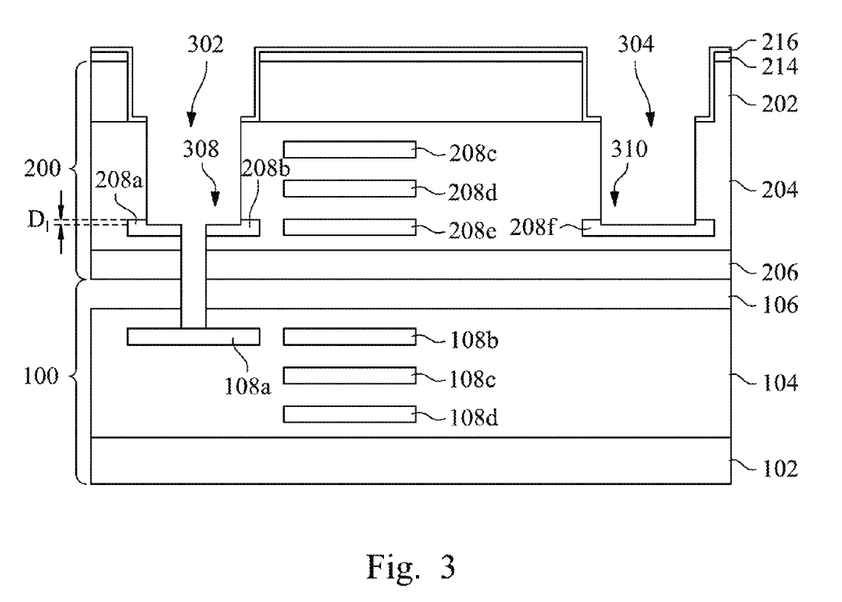

FIG. 3 illustrates the semiconductor device shown in FIG. 2 after one or more additional etching processes are performed in accordance with an embodiment. A suitable etching process, such as a dry etch, an anisotropic wet etch, or any other suitable anisotropic etch or patterning process, may be performed on the semiconductor device to form a third opening 302 and a fourth opening 304.

As illustrated in FIG. 3, the third opening 302 extends the first opening 210 to the second interconnects 208a and 208b, and to the first interconnect 108a. The fourth opening 304 extends the second opening 212 to the second interconnect 208f. In an embodiment, the second interconnects 208 are formed of suitable conductive materials such as copper, which exhibits a different etching rate (selectivity) than the second IMD layers 204. As such, the second interconnects 208a and 208b function as a hard mask layer for an etching process of the second IMD layers 204. A selective etching process may be employed to etch the second IMD layers 204 rapidly while etching only portions of the second interconnects 208a, 208b, and 208f. In some embodiments, the second interconnects 208a and 208b may be dummy conductive lines and may not provide electrical connection between the electrical circuits of the second workpiece 200.

As shown in FIG. 3, the exposed portion of the second interconnects 208a and 208b may be partially etched away, thereby forming a first recess 308 in the second interconnects 208a and 208b, as the etch process continues toward the first interconnect 108a. In addition, the exposed portion of the second interconnect 208f may be partially etched, thereby forming a second recess 310 in the second interconnect 208f. Depths of the first recess 308 and the second recess 310 may vary depending on a variety of applications and design needs. In some embodiments, the first recess 308 has a first depth $D_1$ between about 1000 Å and about 8000 Å, and the second recess 310 has a second depth $D_2$ between about 1000 Å and about 8000 Å. In some embodiments, the second interconnects 208a and 208b, and the second interconnect 208f are subject to the same etch process and, therefore, the first depth $D_1$ is equal to the second depth $D_2$.

The selective etch process continues until the first interconnect 108a and the second interconnect 208f are exposed, thereby forming a first combined opening extending from the backside of the second workpiece 200 to the first interconnect 108a of the first workpiece 100, and a second combined opening extending from the backside of the second workpiece 200 to the second interconnect 208f of the second workpiece 200, as illustrated in FIG. 3.

It should be noted that the selective etch process may extend through a variety of various layers used to form the first IMD layers 104, the second IMD layers 204, the first passivation layer 106, and the second passivation layer 206, which may include various types of materials and etch stop layers. Accordingly, the selective etch process may utilize multiple etchants to etch through the various layers, wherein the etchants are selected based upon the materials being etched.

In some embodiments, the patterned mask 218 may be fully consumed during the selective etch process described above. In other embodiments, a portion of the patterned mask 218 may still remain on the backside of the second workpiece 200 after the selective etch process is completed. The remaining portion of the patterned mask 218 may be removed by using suitable stripping techniques such as chemical solvent cleaning, plasma ashing, dry stripping and/or the like. The techniques are well known and hence are not discussed in further detail herein to avoid repetition.

Figure 4:
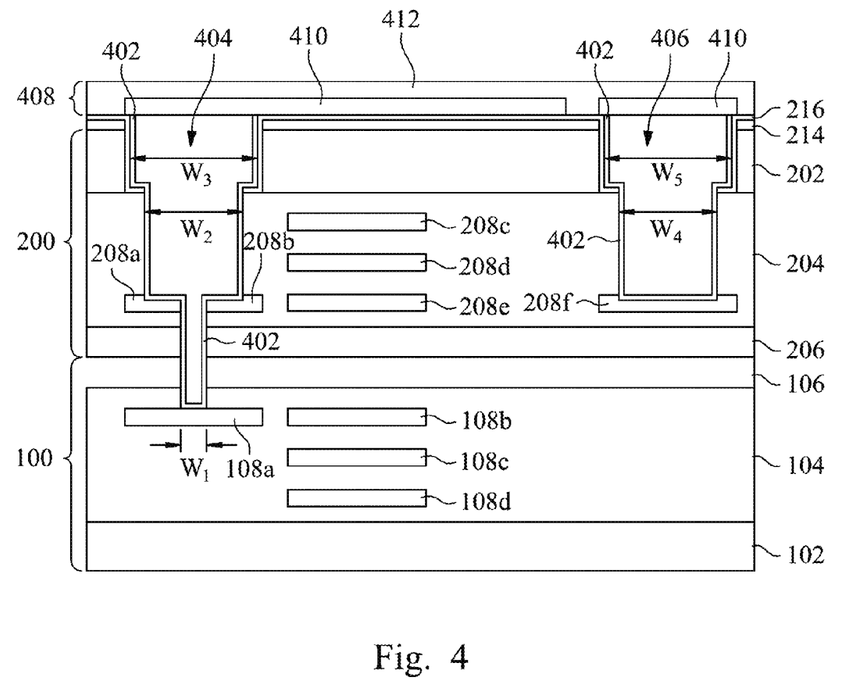

FIG. 4 illustrates various conductive material formed within the first opening 210 and the third opening 302, and within the second opening 212 and the fourth opening 304 in accordance with various embodiments. In some embodiments, the conductive materials may be formed by depositing one or more diffusion and/or barrier layers and depositing a seed layer (not shown). For example, a diffusion barrier layer 402 comprising one or more layers of Ta, TaN, TiN, Ti, CoW, or the like is formed along the sidewalls of the first opening 210, the second opening 212, the third opening 302 and the fourth opening 304. The seed layer may be formed of copper, nickel, gold, any combination thereof and/or the like. The diffusion barrier layer 402 and the seed layer may be formed by suitable deposition techniques such as PVD, CVD and/or the like. Once the seed layer has been deposited in the openings, a conductive material, such as tungsten, titanium, aluminum, copper, any combinations thereof and/or the like, is filled into of the first opening 210, the second opening 212, the third opening 302 and the fourth opening 304, using, for example, an electro-chemical plating process, thereby forming a first conductive plug 404 and a second conductive plug 406 (also referred as through oxide vias (TOVs)).

FIG. 4 also illustrates removal of excess materials, e.g., excess conductive materials, from the backside of the second substrate 202. In some embodiments, the dielectric film 216 may be left along the backside of the second substrate 202 to provide additional protection from the environment. In the illustrated embodiment, the excess conductive materials may be removed using an etch process, a planarization process (e.g., a CMP process), or the like, using the dielectric film 216 as a stop layer.

As shown in FIG. 4, the first conductive plug 404 comprises three portions. A first portion of the first conductive plug 404 is from the first interconnect 108a to the second interconnects 208a and 208b. The first portion of the first conductive plug 404 is of a first width $W_1$ as shown in FIG. 4. A second portion of the first conductive plug 404 is from the second interconnects 208a and 208b to the front side of the second substrate 202. The second portion of the first conductive plug 404 is of a second width $W_2$ as shown in FIG. 4. A third portion of the first conductive plug 404 is from the front side of the second substrate 202 to the backside of the second substrate 202. The third portion of the first conductive plug 404 is of a third width $W_3$ as shown in FIG. 4.

In some embodiments, the third width $W_3$ is greater than the second width $W_2$, and the second width $W_2$ is greater than the first width $W_1$ as illustrated in FIG. 4. The first width $W_1$ may be between about 0.4 µm and about 2 µm, the second width $W_2$ may be between about 0.6 µm and about 8 µm, and the third width $W_3$ may be between about 1.2 µm and about 11 µm.

As also shown in FIG. 4, the second conductive plug 406 comprises two portions. A first portion of the second conductive plug 406 is from the second interconnect 208f to the front side of the second substrate 202. The first portion of the second conductive plug 406 is of a fourth width $W_4$ as shown in FIG. 4. A second portion of the second conductive plug 406 is from the front side of the second substrate 202 to the backside of the second substrate 202. The second portion of the second conductive plug 406 is of a fifth width $W_5$ as shown in FIG. 4.

In some embodiments, the fifth width $W_5$ is greater than the fourth width $W_4$ as illustrated in FIG. 4. The fourth width $W_4$ may be between about 0.6 µm and about 8 µm, and the fifth width $W_5$ may be between about 1.2 µm and about 11 µm.

FIG. 4 further illustrates a first redistribution layer (RDL) 408 formed over the backside of the second workpiece 200 in accordance with some embodiments. In the illustrated embodiment, the first RDL 408 comprises one or more dielectric layers 412 with conductive elements 410 disposed within the one or more dielectric layers 412. In some embodiments, the one or more dielectric layers 412 may be formed using similar materials and methods as the first passivation layer 106 and the description is not repeated herein. Moreover, the conductive elements 410 may be formed using similar materials and methods as the first interconnects 108 and the description is not repeated herein. As described below in greater detail, the first RDL 408 allows for power and signals from the first conductive plug 404 and the second conductive plug 406 to be routed across the backside of the second workpiece 200 to workpieces that are subsequently bonded to the second workpiece 200.

Figure 5:
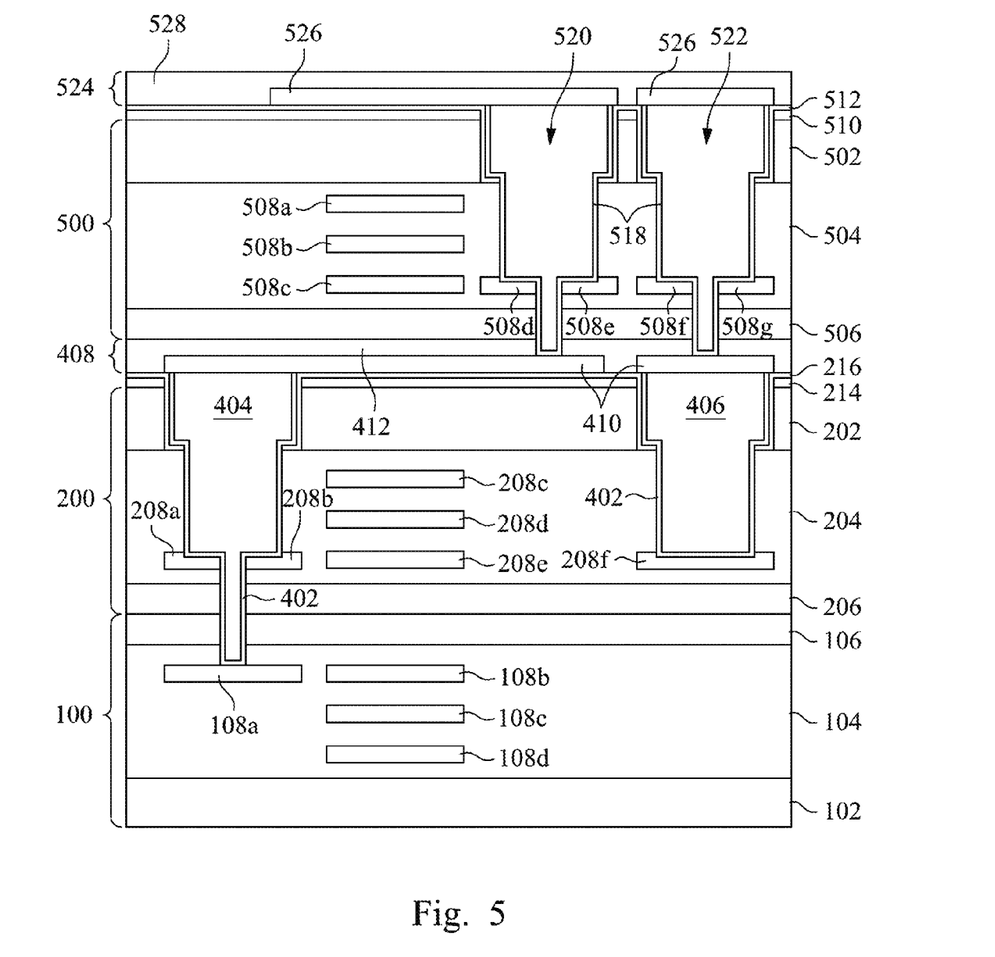

FIG. 5 illustrates a resulting structure after a third workpiece 500 is bonded to the structure of FIG. 4 and contacts are formed on a backside of the third workpiece 500 to electrically interconnect the first workpiece 100, the second workpiece 200, and the third workpiece 500. In an embodiment, the third workpiece 500 has similar features as the first workpiece 100 and the second workpiece 200, and for the purpose of the following discussion, the features of the third workpiece 500 having reference numerals of the form "5xx" are similar to features of the first workpiece 100 having reference numerals of the form "1xx." The various elements of the third workpiece 500 will be referred to as the "third <element> 5xx."

Referring further to FIG. 5, the third workpiece 500 and the structure of FIG. 4 are arranged with a front side of a third substrate 502 facing a backside of the second substrate 202. The third workpiece 500 is bonded to the second workpiece 200 by bonding a third bonding layer 506 to a topmost dielectric layer of the one or more dielectric layers 412. In the illustrated embodiment, the third bonding layer 506 is a third passivation layer 506, and the third workpiece 500 and the second workpiece 200 are bonded using methods as described above with reference to FIG. 2 and the description is not repeated herein.

As shown in FIG. 5, a third conductive plug 520 and a fourth conductive plug 522 are formed to electrically interconnect the third workpiece 500 and the second workpiece 200. In the illustrated embodiment, the third conductive plug 520 and the fourth conductive plug 522 are formed using methods as described above with reference to FIGS. 2-4. In particular, openings are formed on the backside of the third workpiece 500 that are similar to a combined opening comprising the first opening 201 and the third opening 302. The openings are formed to expose the conductive elements 410 of the first RDL 408 using methods as described above with reference to FIGS. 2-3, using a second ARC layer 510, second dielectric film 512, third interconnects 508*d* and 508*e*, and third interconnects 508*f* and 508*g* to aid a patterning process, and the detail description is not repeated herein. In the illustrated embodiment, the third interconnects 508*d* and 508*e* and the third interconnects 508*f* and 508*g* function as hard mask layers as illustrated in FIG. 5.

Subsequently, the openings are filled with various conductive material to form the third conductive plug 520 and the fourth conductive plug 522 comprising a second barrier layer 518 using methods as described above with reference to FIG. 4 and the detailed description is not repeated herein. In the illustrated embodiment, the third conductive plug 520 and the fourth conductive plug 522 have structures similar to the first conductive plug 404 described above with reference to FIG. 4 and the description is not repeated herein. In addition, a second RDL 524 is formed over the backside of the third workpiece 500 using method as described above with reference to FIG. 4 and the description is not repeated herein. In the illustrated embodiment, the second RDL 524 comprises one or more dielectric layers 528 with conductive elements 526 disposed within the one or more dielectric layers 528.

As shown in FIG. 5, the third conductive plug 520 and the fourth conductive plug 522 electrically interconnect the third workpiece 500 to the first workpiece 100 and the second workpiece 200. In particular, the third conductive plug 520 is electrically connected to the first conductive plug 404 using one of the conductive elements 410 of the first RDL 408. In some embodiments, depending on the design of the third workpiece 500, contacts such as the third conductive plug 520 may not be formed at a desired place in the third workpiece 500. For example, in some embodiments, the third conductive plug 520 may not be formed directly above the first conductive plug 404 because the third workpiece 500 may comprise functional circuitry directly above the first conductive plug 404. In such cases, the conductive elements 410 of the first RDL 408 is employed to route an electrical signal from the first conductive plug 404 to a location more appropriate for forming the third conductive plug 520 as illustrated in FIG. 5.

Figure 6:
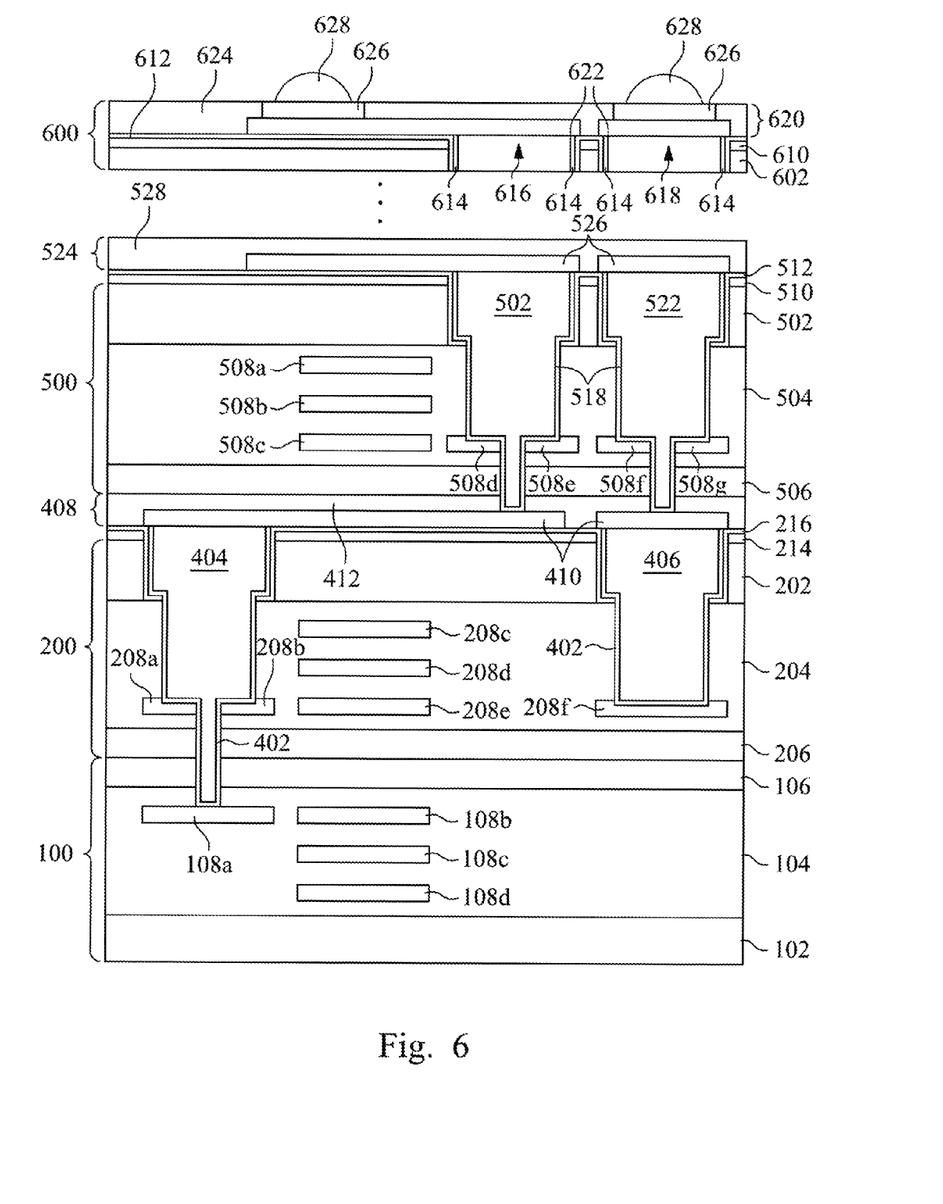

FIG. 6 illustrates a semiconductor structure after one or more additional workpieces are bonded to the semiconductor structure of FIG. 5 and contacts such as, for example, the first conductive plug 404 are formed to electrically interconnect the additional workpieces to the first workpiece 100, the second workpiece 200 and the third workpiece 500. In particular, FIG. 6 illustrates a topmost portion of a topmost workpiece 600 bonded to the semiconductor structure of FIG. 5. In an embodiment, the topmost workpiece 600 has similar features as the first workpiece 100, the second workpiece 200, and the third workpiece 500, and for the purpose of the following discussion, the features of the topmost workpiece 600 having reference numerals of the form "6xx" are similar to features of the first workpiece 100 having reference numerals of the form "1xx." The various elements of the topmost workpiece 600 will be referred to as the "fourth <element> 6xx."

Referring further to FIG. 6, the one or more additional workpieces, such as the topmost workpiece 600, and the semiconductor structure of FIG. 5 are arranged with front sides of substrates of the one or more additional workpieces (e.g., a fourth substrate 602 of the topmost workpiece 600) facing a backside of the third substrate 502. In the illustrated embodiment, the one or more additional workpieces and the semiconductor structure of FIG. 5 are bonded using methods as described above with reference to FIG. 2 and the description is not repeated herein.

After each of the additional workpieces are bonded to a prior semiconductor structure (such as, e.g., the semiconductor structure of FIG. 5), one or more contacts, such as the first conductive plug 404, are formed on a backside of each of the additional workpieces to electrically interconnect each of the additional workpiece to the prior semiconductor structure. In the illustrated embodiments, the contacts are formed using methods as descried above with reference to FIGS. 2-4 and the description is not repeated herein.

Referring further to FIG. 6, the topmost portion of the topmost workpiece 600 comprises the fourth substrate 602, the third ARC layer 610 and the third dielectric film 612 formed thereon. FIG. 6 also illustrates a fifth conductive plug 616 and a sixth conductive plug 618 formed on a backside of the fourth substrate 602. In the illustrated embodiment, the fifth conductive plug 616 and the sixth conductive plug 618 are formed using methods as described above with reference to FIGS. 2-4 and the description is not repeated herein. The fifth conductive plug 616 and the sixth conductive plug 618 comprise a third barrier layer 614 as illustrated in FIG. 6. In addition, a third RDL 620 is formed over the backside of the topmost workpiece 600 using methods as described above with reference to FIG. 4 and the description is not repeated herein. In the illustrated embodiment, the third RDL 620 comprises one or more dielectric layers 624 with conductive elements 622 disposed within the one or more dielectric layers 624.

FIG. 6 also shows that bond pads 626 formed on the third RDL 620 to provide contacts to the conductive elements 622 of the third RDL 620. In an embodiment the bond pads 626 are formed of a conductive material such as aluminum, although other suitable materials, such as copper, tungsten, or the like, may alternatively be utilized. In some embodiment, the third RDL 620 may be patterned using, for example, photolithographic masking and etching process to form openings in the third RDL 620 to expose the conductive elements 622 in the third RDL 620. A suitable material may be deposited to fill the openings using a process such as CVD or PVD, although other suitable materials and methods may alternatively be utilized. Once the material for the bond pads 626 has been deposited, any excessive material overfilling the openings may be removed using an etch process, a planarization process (e.g., a CMP process), or the like, using a topmost dielectric layer of the one or more dielectric layers 624 as a stop layer.

In some embodiments, wire bonds 628 are utilized to allow for electrical connection to components and systems external to a stacked device illustrated in FIG. 6. In an embodiment an electronic flame off (EFO) wand may be used to raise the temperature of a gold wire within a capillary controlled by a wire clamp (not illustrated). Once the temperature of the gold wire is raised to between about 150° C. and about 250° C., the gold wire is contacted to each of the bond pads 626 to form the respective wire bonds 628. Another end of the wire of each of the wire bonds 628 is then contacted and bonded to a ponding pad of an external system to provide electrical connection. One skilled in the art will recognize that ball bonds, solder bumps, micro bumps, copper pillars, and the like may also be used to electrically connect the stacked device of FIG. 6 to external devices.

It should further be noted while FIGS. 1-6 illustrate interconnects (e.g., the second interconnects 208a and 208b) that function a hard mask layer, one skilled in the art will recognize that other features may also be used as hard mask layers. For example, a plurality of isolation regions, polysilicon regions, any combinations thereof and/or the like may be used as the hard mask layers.

Figure 7:
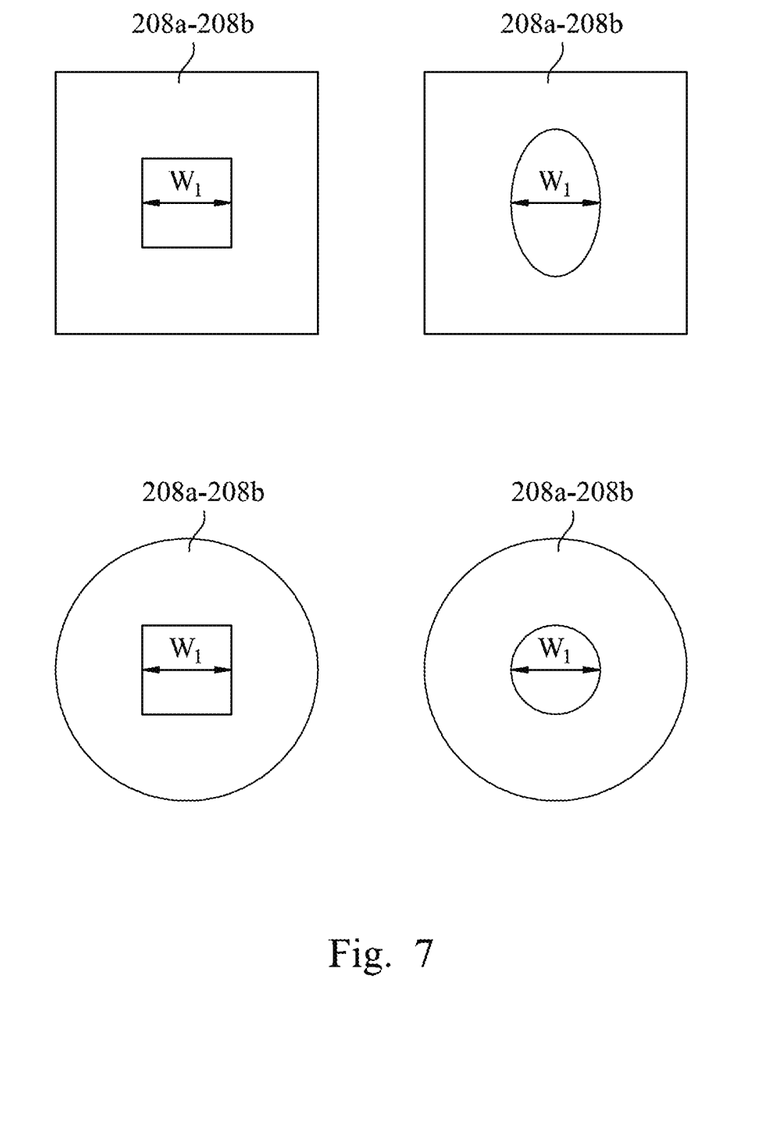
FIG. 7 illustrates exemplary top views of interconnects in accordance with some embodiments.

FIG. 7 illustrates exemplary top views of the second interconnects 208a and 208b in accordance with various embodiments of the present disclosure. While the cross sectional view of the second interconnects 208a and 208b shows that the second interconnect 208a and the second interconnect 208b are two separate interconnects (see FIG. 3), these two interconnects may form a continuous annular shaped region as viewed from top as shown in FIG. 7. In some embodiments, the inside diameter of the annular shaped region is equal to the first width $W_1$. In some embodiments, the third interconnects 508d and 508e, and the third interconnects 508f and 508g may also form annular shaped regions as viewed from top. The annular shapes may be similar to those illustrated in FIG. 7. It should be noted that internal and external surfaces of the annular shaped regions as illustrated in FIG. 7 are for illustrative purpose only and the internal and the external surfaces may have variety of shapes, such as square, circle, oval, triangular, polygonal and/or the like.

Figure 8:
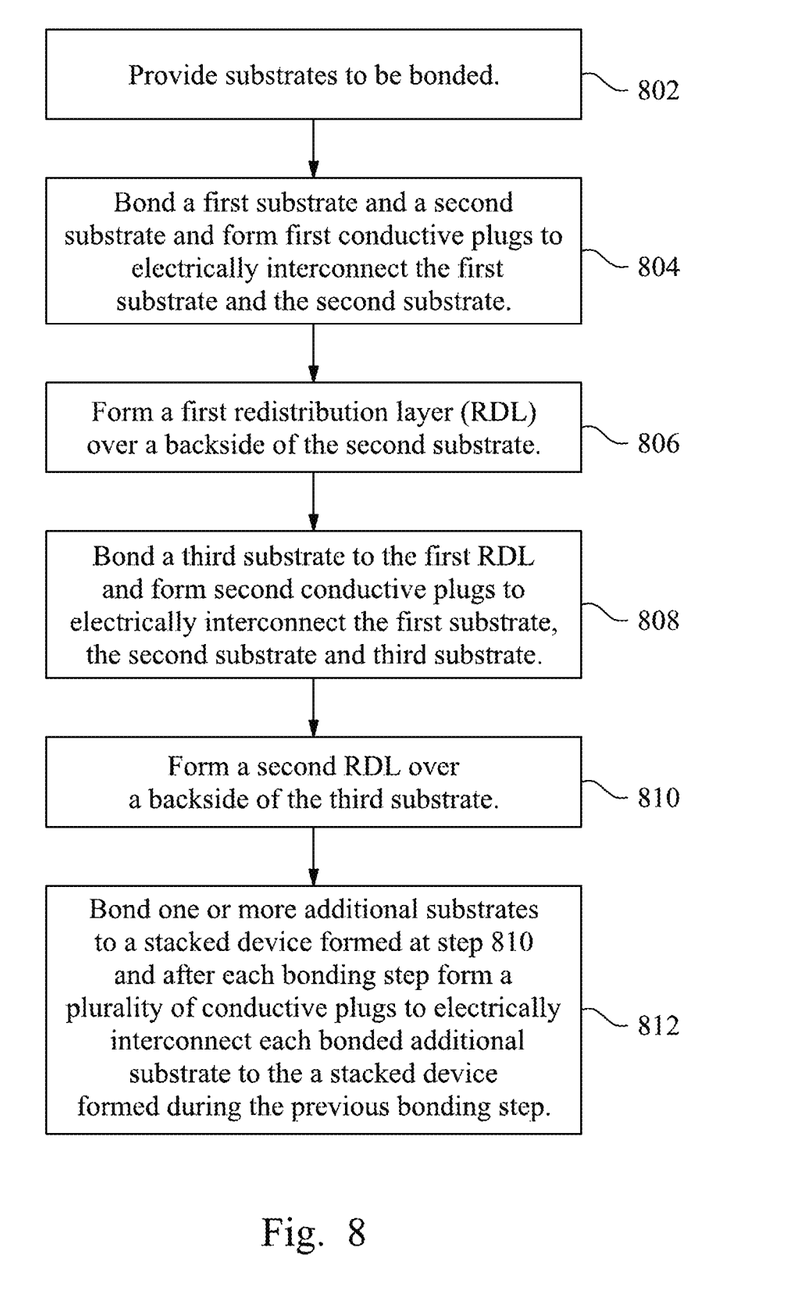
FIG. 8 is a flow diagram illustrating a method of forming interconnect structures between a plurality of bonded workpieces in accordance with some embodiments.

FIG. 8 is a flow diagram illustrating a method of forming interconnect structures between a plurality of bonded workpieces in accordance with some embodiments. The method begins in step 802, wherein a plurality of substrates to be bonded is provided. The substrates may be processed wafers (such as those illustrated, for example, in FIG. 6), dies, a wafer and a die, or the like.

In step 804, a first substrate and a second substrate are bonded as discussed above with reference to FIGS. 1 and 2. Subsequently, first conductive plugs are formed on a backside of the second substrate to electrically interconnect the first substrate and the second substrate as discussed above with reference to FIGS. 2-4. In step 806, a first redistribution layer (RDL), such as that discussed above with reference to FIG. 4, is formed over the backside of the second substrate.

In step 808, a third substrate is bonded to the first RDL layer, and second conductive plugs are formed on a backside of the third substrate as discussed above with reference to FIG. 5. In step 810, a second RDL, such as that discussed above with reference to FIG. 5, is formed over the backside of the third substrate.

In step 812, one or more additional substrates are bonded to a stacked device formed at step 810 as discussed above with reference to FIG. 6. After each bonding step to bond each of the additional substrates to a stacked device formed during the previous bonding step, a plurality of conductive plugs are formed to electrically interconnect each of the additional substrates to the stacked device formed during the previous bonding step as discussed above with reference to FIG. 6. In some embodiments, steps 810 and 812 may be optional and the method may end at step 808.

One advantageous feature of the above described method is that the method allows reduction of a conductive plug critical dimension below the dimension achievable, for example, by conventional photolithography methods. Accordingly, by interconnecting bonded workpieces using conductive plugs as described above with respect to FIGS. 1-6 may lead to semiconductor devices with reduced form factors. In addition, redistribution layers interposed between bonded workpieces may help to rearrange locations of conductive plugs within each of the bonded workpieces.

According to an embodiment, a semiconductor device comprises a first workpiece. The first workpiece comprises a first substrate, and first metallization layers formed on a front side of the first substrate, the first metallization layers having a first interconnect. The semiconductor device further comprises a second workpiece bonded to the first workpiece. The second workpiece comprises a second substrate, and second metallization layers formed on a front side of the second substrate, the second metallization layers having a second interconnect, wherein the front side of the second substrate faces the front side of the first substrate. The semiconductor device further comprises a first redistribution layer (RDL) formed on a backside of the second substrate, the backside of the second substrate being opposite the front side of the second substrate, and a first conductive plug extending from the backside of the second substrate to the first interconnect, the first conductive plug extending through the second interconnect. The semiconductor device further comprises a third workpiece bonded to the second workpiece. The third workpiece comprises a third substrate, and third metallization layers formed on a front side of the third substrate, the third metallization layers having a third interconnect, wherein the front side of the third substrate faces the backside of the second substrate. The semiconductor device further comprises a second conductive plug extending from a backside of the third substrate to the first RDL, the second conductive plug extending through the third interconnect, the backside of the third substrate being opposite the front side of the third substrate.

According to another embodiment, a semiconductor device comprises a first workpiece. The first workpiece comprises a first substrate, first dielectric layers formed on a front side of the first substrate, and a first interconnect formed within the first dielectric layers. The semiconductor device further comprises a second workpiece stacked atop the first workpiece. The second workpiece comprises a second substrate, second dielectric layers formed on a front side of the second substrate, wherein the front side of the first substrate faces the front side of the second substrate, and a second interconnect formed within the second dielectric layers. The semiconductor device further comprises a first redistribution layer (RDL) formed on a backside of the second substrate, the backside of the second substrate being opposite the front side of the second substrate, and a first conductive plug extending from the backside of the second substrate to the first interconnect, the first conductive plug electrically interconnecting the first RDL, the first interconnect, and the second interconnect. The semiconductor device further comprises a third workpiece stacked atop the second workpiece. The third workpiece comprises a third substrate, third dielectric layers formed on a frond side of the third substrate, and a third interconnect formed within the third dielectric layers, wherein the front side of the third substrate faces the backside of the second substrate. The semiconductor device further comprises a second conductive plug extending from a backside of the third substrate to the first RDL, the second conductive plug electrically interconnecting the first RDL and the third interconnect, the backside of the third substrate being opposite the front side of the third substrate.

According to yet another embodiment, a method of forming a semiconductor device, the method comprises providing a first workpiece, the first workpiece having a first interconnect formed in one or more first dielectric layers on a first side of the first workpiece, providing a second workpiece, the second workpiece having a second interconnect formed in one or more second dielectric layers on a first side of the second workpiece, and bonding the first workpiece to the second workpiece such that the first side of the first workpiece faces the first side of the second workpiece. The method further comprises forming a first opening from a second side of the second workpiece, the second side of the second workpiece being opposite the first side of the second workpiece, wherein the first opening extends from the second side of the second workpiece to the first interconnect, the first opening extending through the second interconnect, filling the first opening with a conductive material, and forming a first redistribution layer (RDL) on the second side of the second workpiece. The method further comprises providing a third workpiece, the third workpiece having a third interconnect formed in one or more third dielectric layers on a first side of third workpiece, and bonding the third workpiece to the second workpiece such that the first side of the third workpiece faces the second side of the second workpiece. The method further comprises forming a second opening from a second side of the third workpiece, the second side of the third workpiece being opposite the first side of the third workpiece, wherein the second opening extends from the second side of the third workpiece to the first RDL, the second opening extending through the third interconnect, and filling the second opening with the conductive material.

According to yet another embodiment, a semiconductor device includes a first workpiece. The first workpiece includes a first substrate, and first metallization layers on a front side of the first substrate, the first metallization layers having a first interconnect. The semiconductor device further includes a second workpiece bonded to the first workpiece. The second workpiece includes a second substrate, and second metallization layers on a front side of the second substrate, the second metallization layers having a second interconnect, wherein the front side of the second substrate faces the front side of the first substrate. The semiconductor device further includes a first redistribution layer (RDL) on a backside of the second substrate, the backside of the second substrate being opposite the front side of the second substrate. The semiconductor device further includes a first conductive plug extending from the backside of the second substrate to the first interconnect, wherein the first conductive plug extends through the second interconnect, wherein the first conductive plug has a first width as it extends from the backside of the second substrate to the front side of the second substrate, a second width as it extends from the front side of the second substrate to the second interconnect and a third width as it extends from the second interconnect to the first interconnect, wherein the first width is greater than the second width, and wherein the second width is greater than the third width. The semiconductor device further includes a third workpiece bonded to the second workpiece. The third workpiece includes a third substrate, and third metallization layers on a front side of the third substrate, the third metallization layers having a third interconnect, wherein the front side of the third substrate faces the backside of the second substrate. The semiconductor device further includes a second conductive plug extending from a backside of the third substrate to the first RDL, the second conductive plug extending through the third interconnect, the backside of the third substrate being opposite the front side of the third substrate.

According to yet another embodiment, a semiconductor device includes a first workpiece. The first workpiece includes a first substrate, first dielectric layers on a front side of the first substrate, and a first interconnect within the first dielectric layers. The semiconductor device further includes a second workpiece stacked atop the first workpiece. The second workpiece includes a second substrate, second dielectric layers on a front side of the second substrate, wherein the front side of the first substrate faces the front side of the second substrate, and a second interconnect within the second dielectric layers. The semiconductor device further includes a first redistribution layer (RDL) on a backside of the second substrate, the backside of the second substrate being opposite the front side of the second substrate. The semiconductor device further includes a first conductive plug extending from the backside of the second substrate to the first interconnect, the first conductive plug electrically interconnecting the first RDL, the first interconnect, and the second interconnect, wherein the first conductive plug has a first width within the second substrate, a second width within the second dielectric layers and a third width within the second interconnect, wherein the first width is greater than the second width, and wherein the second width is greater than the third width. The semiconductor device further includes a third workpiece stacked atop the second workpiece. The third workpiece includes a third substrate, third dielectric layers on a frond side of the third substrate, and a third interconnect within the third dielectric layers, wherein the front side of the third substrate faces the backside of the second substrate. The semiconductor device further includes a second conductive plug extending from a backside of the third substrate to the first RDL, the second conductive plug electrically interconnecting the first RDL and the third interconnect, the backside of the third substrate being opposite the front side of the third substrate.

According to yet another embodiment, a semiconductor device includes a first workpiece. The first workpiece includes a first substrate, a first conductive feature on a front side of the first substrate, and a first insulating layer on the front side of the first substrate, the first conductive feature being interposed between the first substrate and the first insulating layer. The semiconductor device further includes a second workpiece bonded to the first workpiece. The second workpiece includes a second substrate, a second conductive feature on a front side of the second substrate, and a second insulating layer on the front side of the second substrate, the second conductive feature being interposed between the second substrate and the second insulating layer, the second insulating layer physically contacting the first insulator layer. The semiconductor device further includes a first redistribution layer (RDL) on a backside of the second substrate, the backside of the second substrate being opposite the front side of the second substrate. The semiconductor device further includes a first conductive plug extending from the backside of the second substrate to the first conductive feature, wherein the first conductive plug has a first width as it extends from the backside of the second substrate to the front side of the second substrate, a second width as it extends from the front side of the second substrate to the second conductive feature and a third width as it extends through the first insulating layer and the second insulating layer, wherein the first width is greater than the second width, and wherein the second width is greater than the third width. The semiconductor device further includes a third workpiece bonded to the second workpiece. The third workpiece includes a third substrate, a third conductive feature on a front side of the third substrate, and a third insulating layer on the front side of the third substrate, the third conductive feature being interposed between the third substrate and the third insulating layer, the third insulating layer physically contacting the first RDL. The semiconductor device further includes a second conductive plug extending from a backside of the third substrate to the first RDL, the backside of the third substrate being opposite the front side of the third substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    a first workpiece comprising:
        a first substrate; and
        first metallization layers on a front side of the first substrate, the first metallization layers having a first interconnect;
    a second workpiece bonded to the first workpiece, the second workpiece comprising:
        a second substrate; and
        second metallization layers on a front side of the second substrate, the second metallization layers having a second interconnect, wherein the front side of the second substrate faces the front side of the first substrate;
    a first redistribution layer (RDL) on a backside of the second substrate, the backside of the second substrate being opposite the front side of the second substrate;
    a first conductive plug extending from the backside of the second substrate to the first interconnect, wherein the first conductive plug extends through the second interconnect, wherein the first conductive plug has a first width as it extends from the backside of the second substrate to the front side of the second substrate, a second width as it extends from the front side of the second substrate to the second interconnect and a third width as it extends from the second interconnect to the first interconnect, wherein the first width is greater than the second width, wherein the second width is greater than the third width, and wherein the first conductive plug narrows as it extends through the second interconnect toward to the first interconnect;
    a third workpiece bonded to the second workpiece, the third workpiece comprising:
        a third substrate; and
        third metallization layers on a front side of the third substrate, the third metallization layers having a third interconnect, wherein the front side of the third substrate faces the backside of the second substrate; and
    a second conductive plug extending from a backside of the third substrate to the first RDL, the second conductive plug extending through the third interconnect, the backside of the third substrate being opposite the front side of the third substrate.

2. The semiconductor device of claim 1, further comprising a second RDL on the backside of the third substrate, the second RDL being in electrical contact with the second conductive plug.

3. The semiconductor device of claim 1, wherein the first conductive plug is in electrical contact with the first RDL, the first interconnect, and the second interconnect.

4. The semiconductor device of claim 1, wherein the second conductive plug is in electrical contact with the first RDL and the third interconnect.

5. The semiconductor device of claim 1, wherein the second interconnect has an annular shape as viewed from top.

6. The semiconductor device of claim 1, further comprising a third conductive plug extending from the backside of the second substrate to a fourth interconnect of the second metallization layers, the third conductive plug being in electrical contact with the first RDL and the fourth interconnect.

7. The semiconductor device of claim 6, wherein the third conductive plug has a first width as it extends from the backside of the second substrate to the front side of the second substrate and has a second width as it extends from the front side of the second substrate to the fourth interconnect in the second metallization layers, the second width being smaller than the first width.

8. A semiconductor device comprising:
    a first workpiece comprising:
        a first substrate;
        first dielectric layers on a front side of the first substrate; and
        a first interconnect within the first dielectric layers;
    a second workpiece stacked atop the first workpiece, the second workpiece comprising:
        a second substrate;
        second dielectric layers on a front side of the second substrate, wherein the front side of the first substrate faces the front side of the second substrate; and
        a second interconnect within the second dielectric layers;
    a first redistribution layer (RDL) on a backside of the second substrate, the backside of the second substrate being opposite the front side of the second substrate;
    a first conductive plug extending from the backside of the second substrate to the first interconnect, the first conductive plug electrically interconnecting the first RDL, the first interconnect, and the second interconnect, wherein the first conductive plug has a first width within the second substrate, a second width within the second interconnect, and a third width within the first dielectric layers, wherein the first width is greater than the second width, and wherein the second width is greater than the third width;
    a third workpiece stacked atop the second workpiece, the third workpiece comprising:
        a third substrate;
        third dielectric layers on a frond side of the third substrate; and
        a third interconnect within the third dielectric layers, wherein the front side of the third substrate faces the backside of the second substrate; and
    a second conductive plug extending from a backside of the third substrate to the first RDL, the second conductive plug electrically interconnecting the first RDL and the third interconnect, the backside of the third substrate being opposite the front side of the third substrate.

9. The semiconductor device of claim 8, further comprising a second RDL on the backside of the third substrate, wherein the second conductive plug is electrically interposed between the second RDL and the third interconnect.

10. The semiconductor device of claim 9, wherein the first RDL is electrically interconnected with the second RDL.

11. The semiconductor device of claim 8, wherein the first conductive plug is laterally displaced from the second conductive plug.

12. The semiconductor device of claim 8, wherein the second interconnect has an annular shape as viewed from top.

13. The semiconductor device of claim 8, further comprising a third conductive plug extending from the first RDL to a fourth interconnect within the second dielectric layers, the third conductive plug providing electrical contact between the first RDL and the fourth interconnect.

14. The semiconductor device of claim 13, wherein the third conductive plug has a first width as it extends through the second substrate and has a second width as it extends through a first dielectric layer of the second dielectric layers, the first dielectric layer being a dielectric layer closest to the second substrate, the second width being smaller than the first width.

15. A semiconductor device comprising:
a first workpiece comprising:
a first substrate;
a first conductive feature on a front side of the first substrate; and
a first insulating layer on the front side of the first substrate, the first conductive feature being interposed between the first substrate and the first insulating layer;
a second workpiece bonded to the first workpiece, the second workpiece comprising:
a second substrate;
a second conductive feature on a front side of the second substrate; and
a second insulating layer on the front side of the second substrate, the second conductive feature being interposed between the second substrate and the second insulating layer, the second insulating layer physically contacting the first insulator layer;
a first redistribution layer (RDL) on a backside of the second substrate, the backside of the second substrate being opposite the front side of the second substrate;
a first conductive plug extending from the backside of the second substrate to the first conductive feature, wherein the first conductive plug has a first width as it extends from the backside of the second substrate to the front side of the second substrate, a second width as it extends from the front side of the second substrate to the second conductive feature, a third width as it extends through the first insulating layer and the second insulating layer, and the second width and the third width as it extends through the second conductive feature, wherein the first width is greater than the second width, and wherein the second width is greater than the third width;
a third workpiece bonded to the second workpiece, the third workpiece comprising:
a third substrate;
a third conductive feature on a front side of the third substrate; and
a third insulating layer on the front side of the third substrate, the third conductive feature being interposed between the third substrate and the third insulating layer, the third insulating layer physically contacting the first RDL; and
a second conductive plug extending from a backside of the third substrate to the first RDL, the backside of the third substrate being opposite the front side of the third substrate.

16. The semiconductor device of claim 15, further comprising a third conductive plug extending from the first RDL to a fourth conductive feature on the front side of the second substrate, the fourth conductive feature being interposed between the second substrate and the second insulating layer.

17. The semiconductor device of claim 16, wherein the first RDL electrically couples the second conductive plug and the third conductive plug.

18. The semiconductor device of claim 15, wherein the first RDL electrically couples the first conductive plug and the second conductive plug.

19. The semiconductor device of claim 15, wherein the second conductive feature has an annular shape as viewed from top.

20. The semiconductor device of claim 15, further comprising a second RDL on the backside of the third substrate, wherein the second conductive plug electrically couples the first RDL and the second RDL.

* * * * *